United States Patent [19]

Baba

[11] Patent Number: 4,891,708

[45] Date of Patent: Jan. 2, 1990

[54] VOLTAGE SUPERPOSING CIRCUIT FOR AN ELECTRONIC TUNER

[75] Inventor: Mitsuhiro Baba, Fukaya, Japan

[73] Assignee: Kabushiki Kaisha Toshiba, Kawasaki, Japan

[21] Appl. No.: 312,947

[22] Filed: Feb. 21, 1989

[30] Foreign Application Priority Data

Feb. 26, 1988 [JP] Japan ............................. 63-25522[U]

[51] Int. Cl.⁴ .............................................. H04N 5/50
[52] U.S. Cl. ............................. 358/195.1; 358/191.1; 455/182
[58] Field of Search .......................... 358/191.1, 195.1; 455/164, 182, 183, 184, 192

[56] References Cited

U.S. PATENT DOCUMENTS

| 3,858,000 | 12/1974 | Merriweather | 358/195.1 |
| 4,344,187 | 8/1982 | Ogita et al. | 455/182 |
| 4,630,118 | 12/1986 | Suzuki | 358/195.1 |
| 4,748,684 | 5/1988 | Wright, Jr. | 358/195.1 |
| 4,814,887 | 3/1989 | Marz et al. | 358/195.1 |

Primary Examiner—John K. Peng
Attorney, Agent, or Firm—Cushman, Darby & Cushman

[57] ABSTRACT

A pulse signal whose duty ratio differs for selected channels is coupled with the base of a first transistor as a switching transistor. The switching transistor is connected at the collector to a voltage source via a load resistor, and at the emitter to a reference potential point. An inverted pulse signal, which is derived from the collector of the first transistor, is rectified by a rectifying filter including a capacitor, and subsequently is applied to a tuning voltage terminal of an electronic tuner. A DC voltage proportional to an AFT voltage is applied to the base of a second transistor whose collector-emitter major current path is connected between a charge/discharge path of the capacitor and the reference potential point. A current flow through the major current path for a period of time, which differs for selected channels.

15 Claims, 5 Drawing Sheets

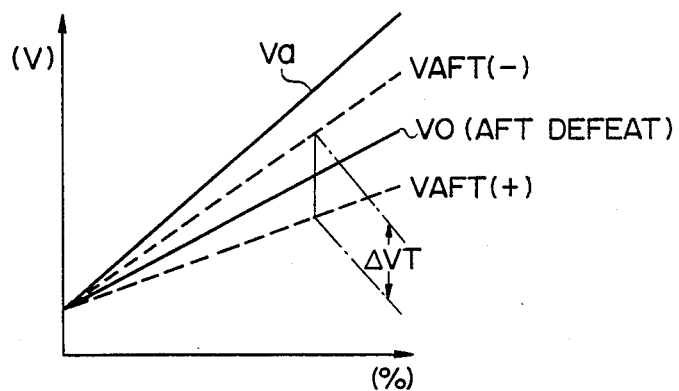
F I G. 7

VOLTAGE SUPERPOSING CIRCUIT FOR AN ELECTRONIC TUNER

BACKGROUND OF THE INVENTION

1. Field of the Invention

The present invention relates to a voltage superposing circuit in use with an electronic tuner, and more particularly to a voltage superposing circuit for superposing a tuning voltage supplied to an electronic tuner used in a liquid crystal television receiver, for example, on a voltage for automatic fine tuning.

2. Description of the Related Art

An electronic tuner used for a liquid crystal television (TV) receiver, for example, is generally composed of a tuning circuit, a local oscillator, and a mixer. In the tuning circuit, a resonance frequency is varied in accordance with the frequency of a TV channel selected. To vary the resonance frequency, a channel select circuit applies a tuning voltage to the tuning circuit, more exactly, a bias voltage to a variable diode contained in the tuning circuit. An oscillating frequency of the local oscillator varies depending on ambient temperature, aging of components contained therein. To maintain a correct local oscillating frequency, an automatic fine tuning (AFT) circuit is provided, which produces an AFT voltage for correcting a deviation of the oscillating frequency due to such factors, and applies it to the electronic tuner.

The AFT circuit detects a deviation from a center frequency of an intermediate frequency (IF) derived from the electronic tuner, and produces a DC voltage (AFT voltage) in proportion to the detected deviation. The AFT voltage controls the local oscillating frequency of the tuner so that the deviation of the IF center frequency f0 is removed. The result is stabilization of the IF frequency.

FIG. 1 shows a relationship between an AFT voltage vs. a shift of the center frequency f0 of the IF frequency. In the graph, an ordinate represents the AFT voltage and an abscissa represents the shift of the center frequency f0. V0 indicates a reference voltage providing the center frequency f0 (58.75 MHz in the Japanese TV standard). As seen from the graph, when the center frequency of an IF signal outputted from the electronic tuner is shifted from the center frequency f0 to the higher (+) side, the AFT circuit produces an AFT voltage lower than the voltage V0. On the other hand, when it is shifted to the lower (−) side, the AFT circuit produces an AFT voltage higher than the voltage V0. In this way, a predetermined pull-in range to stabilize the IF frequency is set up by the AFT voltage.

The electronic tuner thus constructed may be classified into two types. One of those types of tuner is provided with two input terminals, one receiving an AFT voltage and the other for receiving a tuning voltage. The other type of the tuners is provided with only one input terminal for receiving a tuning voltage. The latter type of the tuner requires a circuit to control a tuning voltage directly by an AFT voltage, viz, a voltage superposing circuit for superposing an AFT voltage on the tuning voltage.

An example of the voltage superposing circuit follows. A channel select voltage terminal receives a channel select voltage. This voltage is generated when a viewer manually operates a channel select knob of the TV set for selecting his desired channel. The terminal is connected to the base of a first npn transistor. The transistor is connected at the collector to a first voltage source terminal. The emitter of the transistor is connected through a first resistor to a tuning voltage terminal of the electronic tuner. An AFT voltage terminal receives an AFT voltage from an AFT circuit. The AFT voltage terminal is connected to a connection point between second and third resistors. These resistors are connected in series between a second voltage source terminal and a reference potential point. The connection point between the second and third resistors is connected through a fourth resistor to the emitter of a second npn transistor. The second transistor is connected at the collector to the tuning voltage terminal of the electronic tuner. The base of the second transistor is connected to a connection point between fifth and sixth resistors. These fifth and sixth resistors are connected in series between the second voltage source and the reference potential point. The emitter of the second transistor is connected through a seventh resistor to the reference potential point.

In the voltage superposing circuit thus constructed, a voltage appearing the connection point between the second and third resistors corresponds to the voltage V0. The voltage depends on a resistance ratio of those resistors. A current flowing from the first resistor to the collector of the second transistor varies in accordance with the AFT voltage applied to the AFT voltage terminal. A variation of the tuning voltage applied to the tuning voltage terminal of the tuner provides a voltage component to automatically control a local oscillating frequency of the tuner. Assuming that resistance of the first resistor is R, and a current flowing from the first resistor to the collector of the second resistor is I, a variation of the current I is ΔI and a variation of the tuning voltage, i.e., an AFT voltage component, is R×ΔI.

Another example of the voltage superposing circuit will be given below. A channel voltage select terminal for receiving a channel select voltage is connected through an eighth resistor to a tuning voltage terminal of an electronic tuner. An AFT terminal is connected to a connection point between ninth and tenth resistors which are connected in series between a third voltage source terminal and the reference potential point. The connection point is connected through an eleventh resistor to the tuning voltage terminal of the tuner.

Assuming that a resistance of the eighth resistor is R′ and a current flowing from the eighth resistor to the eleventh resistor is I′ when the voltage, V0, appears at the connection point between the ninth and tenth resistors, an AFT voltage component is given by R′×ΔI′.

Relationships between the tuning voltage and the frequencies of TV channels are illustrated in FIG. 2. In the figure, the ordinate indicates a tuning voltage VT, and the abscissa indicates channel number. A curve A represents a variation of the tuning voltage VT in the VHF low band; a curve B represents a variation of the tuning voltage VT in the VHF high band; and a curve C represents a variation of the tuning voltage VT in the UHF band.

It is noted that these curves indicating the tuning voltage vs. channel number characteristics are non-linear, and that a frequency variation corresponding to the variation of the tuning voltage VT becomes greater, the higher the channel number is. In the tuner operating in the AFT mode, the pull-in range in the lower channel numbers is broad, while that in the higher channel numbers is narrow, because the varied voltage component $R \times \Delta I$, for example, is constant over the entire range of the channel numbers. The nonuniform AFT pull-in ranges make the receiving characteristics of the TV set nonuniform over the range of the TV channels. This indicates that some channels are received in satisfactory conditions, but some channels are received in unsatisfactory conditions.

SUMMARY OF THE INVENTION

Accordingly, an object of the present invention is to provide a voltage superposing circuit in use with an electronic tuner in which the AFT pull-in range is uniform over the entire range of channel numbers or frequency bands.

To achieve the above object, there is provided a voltage superposing circuit for supplying a tuning signal including the superposition of a channel select voltage on an automatic fine tuning (AFT) voltage to a tuning voltage terminal of an electronic tuner, comprising:

a first transistor, with a switching function, for inverting the channel select pulse signal, the base of the first transistor being supplied with a channel select pulse signal, the collector thereof being connected through a load resistor to a voltage source, and the emitter thereof being connected to a reference potential point, the channel select pulse signals of the respective channels having different duty ratios and hence the ratios of the on- and off-periods of the first transistor differing for the respective channels;

voltage supply means for rectifying and smoothing a pulse signal at the collector of the first transistor and supplying the rectified and smoothed pulse signal to the tuning voltage terminal of the electronic tuner, the voltage supply means containing capacitive means, being coupled with the voltage source in a DC mode, for charging and discharging under control of the switching operation of the first transistor; and transistor means of which the base is supplied with a DC voltage proportional to the AFT voltage, and the collector-emitter major current path is connected between a charge/discharge path of the capacitive means and the reference potential point.

With such an arrangement, a pulse duty of a pulse signal for channel selection changes for each channel, so that a ratio of the on-period and off-period of the first transistor changes every channel. Consequently, a major current of the transistor means flowing through the load resistor is constant in value, but a flowing period of the major current differs every channel. The present invention makes use of this feature of the major current of the transistor means Of the charge/discharge current of the capacitor in the voltage supply means, an AFT operation component is varied to control a variation of the AFT voltage for each channel. In this way, the AFT pull-in range may be made uniform for all the TV channels.

BRIEF DESCRIPTION OF THE DRAWINGS

FIG. 7 shows a relationship between a tuning voltage vs. pulse duty ratio;

DETAILED DESCRIPTION OF THE PREFERRED EMBODIMENTS

Figure 3:
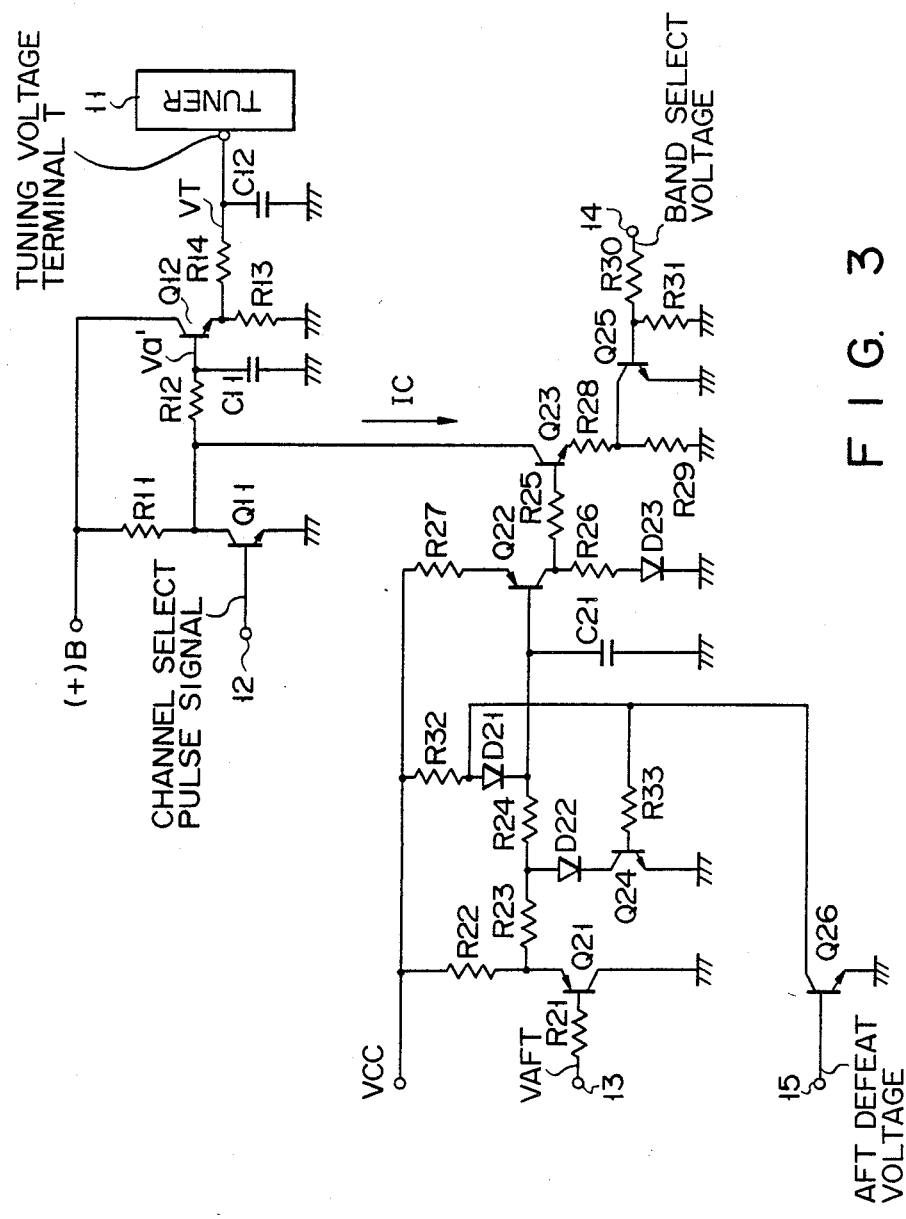
FIG. 3 is a circuit diagram showing a voltage superposing circuit for an electronic tuner according to an embodiment of the present invention.

Referring to FIG. 3, there is shown a voltage superposing circuit for an electronic tuner according to an embodiment of the present invention, which is coupled with an electronic tuner 11 of the type having a tuning voltage terminal T as a voltage supplying terminal for receiving a voltage for channel selecting. The tuner 11 receives an RF signal from an antenna (not shown) at an RF input terminal (not shown), and outputs an IF signal at an IF output terminal (not shown).

In the voltage superposing circuit, a channel select pulse signal is applied to an input terminal 12. The input terminal 12 is connected to the base of a npn transistor Q11 that is switched in response to the channel select pulse. The transistor Q11 is connected at the emitter to a reference potential point. The collector of the transistor Q11 is connected through a load resistor R11 to a voltage source terminal (+)B. The collector of the transistor Q11 is connected to a rectifying filter including a resistor R12 and a capacitor C11. Through the filter, a DC voltage proportional to a duration of the off period of the transistor Q11 appears at the output terminal of the capacitor C11, viz., a connection point of the resistor R12 and capacitor C11. The DC voltage corresponds to a channel select voltage of the conventional circuit. The voltage across the capacitor C11 is applied to the base of an npn transistor Q12. The emitter of the transistor Q12 is connected through a resistor R13 to the reference potential point. The collector of the transistor Q12 is connected to the voltage source terminal (+)B. The DC voltage appearing at the emitter of the transistor Q12 is led to the tuning voltage terminal T through a smoothing circuit made up of a resistor R14 and a capacitor C12.

A circuitry including transistors Q21 to Q26 converts an AFT voltage appearing at an input terminal 13 into a corresponding current, and feeds it to the rectifying filter. The terminal 13 is coupled through a resistor R21 to the base of the pnp transistor Q21 whose collector is connected to the reference potential point. A voltage proportional to the AFT voltage VAFT is derived from the emitter of this transistor Q21 and is applied to the base of a level-shift pnp transistor Q22, through a series circuit of resistors R23 and R24.

This transistor Q22 is connected at the base to one end of a capacitor C21 whose other end is connected to the reference potential point. The emitter of the transistor Q22 is connected through a resistor R27 to a voltage source circuit Vcc. The collector of the transistor Q22 is connected to the reference potential point through a series circuit of a resistor R26 and a diode D23, and further is connected through a resistor R25 to the base of an npn transistor Q23 for AFT voltage superposing. The emitter of this transistor Q23 is connected to the reference potential point through a series circuit of resistors R28 and R29. The collector of the transistor Q23 is connected to the collector the transistor Q11. With this connection, during the off-period of the transistor Q11, the transistor Q23 is turned on to convert the AFT voltage VAFT into a current, and feed it to the rectifying filter.

Reference numeral 14 designates an input terminal for a band select voltage. The terminal 14 is connected to the base of the npn transistor Q25 through a resistor R30. The base of the transistor Q25 is connected through a resistor R31 to the reference potential point, and the emitter is directly connected to the reference potential point. The collector of the transistor Q25 is connected to a connection point between the resistors R28 and R29. Thus, a band select voltage inputted to the terminal 14 is applied to the connection point between the resistors R28 and R29, by way of the resistors R30 and R31 and the transistor Q25.

The emitter of the transistor Q21 is connected to the voltage source terminal Vcc by way of a resistor R22. A series circuit made up of a resistor R32 and a diode D21 is connected between the base of the transistor Q22 and the voltage source terminal Vcc. The connection point between the resistors R23 and R24 is connected to the reference potential point by way of a diode D22 and a collector-emitter path of the npn transistor Q24.

A terminal 15 receives an AFT defeat voltage, and is connected to the base of the npn transistor Q26 whose emitter is connected to the reference potential point. The collector of this transistor Q26 is connected to the anode of the diode D21 and also to the base of the transistor Q24

Figure 6:
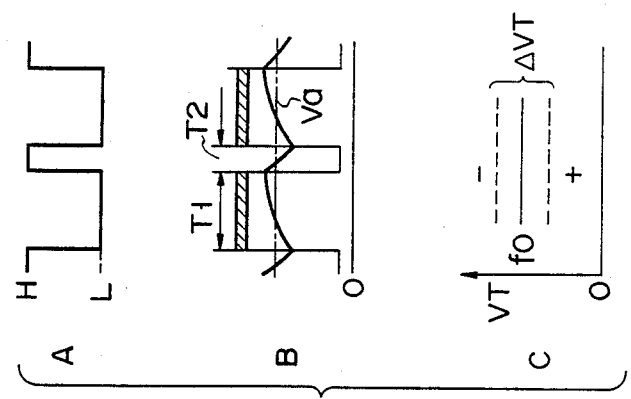
FIGS. 6A to 6C show graphic representations of a channel select pulse signal, a channel select voltage and a range of variation of a AFT voltage in the high channel numbers.
Figure 5:
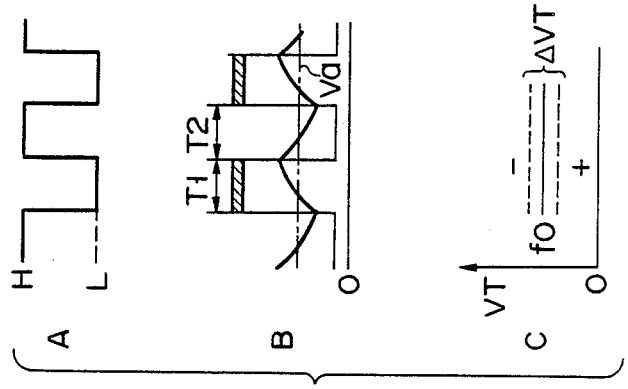
FIGS. 5A to 5C show graphic representations of a channel select pulse signal, a channel select voltage and a range of variation of an AFT voltage in the medium channel numbers.
Figure 4:
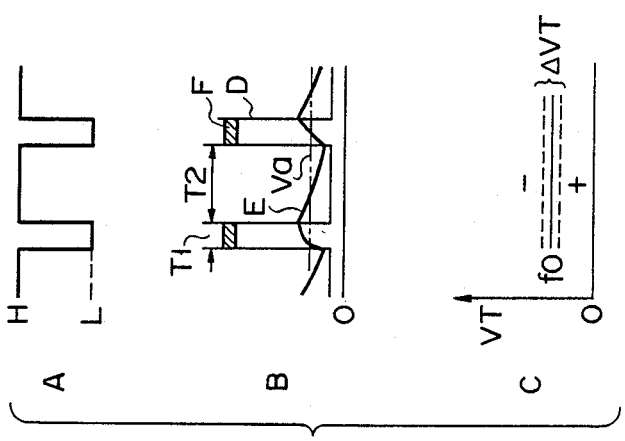
FIGS. 4A to 4C show graphic representations of a channel select pulse signal, a channel select voltage and a range of variation of an AFT voltage in the low channel numbers.

An operation of the voltage superposing circuit thus arranged will be described. FIGS. 4A, 5A, and 6A show respectively the waveforms of the channel select pulse signal for selecting low, medium, and high channels. As shown, the channel select pulse signal has different duty ratios for channel numbers. FIGS. 4B, 5B, and 6B show respectively channel select voltages in connection with the channel select pulse signals in FIGS. 4A, 5A, and 6A. FIGS. 4C, 5C, and 6C show respectively the ranges of variations of an AFT voltage in connection with the channel select pulse signals in FIGS. 4A, 5A, and 6A.

FIGS. 4A through 4C show how the voltage superposing circuit operates when low channel in a TV band (for example, the channel 1 in the VHF low band) is selected. In the operation, a channel select pulse signal as shown in FIG. 4A is applied to the terminal 12. In response to the pulse signal, the transistor Q11 is repetitively switched to produce a pulse signal D (solid line) as shown in FIG. 4B. The pulse signal D further causes a channel select voltage Va also shown in FIG. 4B. A variation of a tuning voltage VT and a range of a change voltage $\Delta VT$ due to a change of an AFT voltage are illustrated in FIG. 4C.

As seen from FIG. 4A, when a low channel frequency is selected, a pulse period (low level period) of the channel select pulse signal is shorter than an inverted period (high level period). The transistor Q11 inverts the pulse signal of such a waveform. Accordingly, a waveform of a pulse signal appearing at the collector terminal of the transistor Q11 (indicated by a solid line D in FIG. 4B) is the inversion of that of the pulse signal of FIG. 4A. A high level period T1 of the output pulse D corresponds to the off-period of the transistor Q11. During this period T1, a voltage from the voltage source terminal (+)B is applied through the resistor R11 to the capacitor C11, to charge the capacitor. During a low level period T2, the transistor Q11 is in an on state. During this period T2, the capacitor C11 is discharged through the transistor Q11. The charge/discharge of the capacitor C11 is conducted along a curve E as indicated by a solid line in FIG. 4B. Therefore, an average voltage (indicated by a one-dot-chain line in FIG. 4B) appears at the output terminal of the capacitor C11, as a DC voltage (channel select voltage Va) which is determined by a ratio of the periods T1 and T2.

An AFT voltage VAFT appears at the base of the transistor Q22, through a route of the resistor R21, the base-emitter path of the transistor Q21, and resistors R23 and R24. The transistor Q22 produces at the collector the AFT voltage as is level shifted by the diode D23. In response to the level shifted AFT voltage, the transistor Q23 is turned on to provide a current path. During the off-period of the transistor Q11, the path shunts the current flowing from the resistor R11 toward the resistor R12, thereby to adjust the charge current to the capacitor C11. As a result, the voltage appearing at the output terminal of the capacitor C11, viz., a voltage Va' (FIG. 3) appearing at the base of the transistor Q12, includes the superposition of a change of the AFT voltage VAFT to the channel select voltage Va.

It is assumed now that the operating current of the transistor Q23 when the AFT voltage is at V0, is Ic. A change $\Delta Ic$ of the operating current Ic, which depends on a change, or a level shift, of the AFT voltage, is fixed. In this instance, the transistor Q23 turns on only during the off-period T1 of the transistor Q11. Therefore, the charge current is adjusted by a value of the change $\Delta Ic$, during the off-period T1. In FIG. 4B, a shaded portion F indicates a voltage change amounting to the change $\Delta Ic$ of the operating current Ic of the transistor Q23. The voltage change is denoted as delta $\Delta VT$ and defined by two parallel dotted lines in FIG. 4C. As shown, the change $\Delta VT$ exists on both sides of the reference tuning voltage V0 (indicated by a solid line in FIG. 4C) which provides the center frequency f0 of the intermediate frequency. Within the range of the voltage change $\Delta VT$, the tuning voltage VT is adjusted. Thus, this voltage range $\Delta VT$ indicates an AFT pull-in range.

Likewise, FIGS. 5A through 5C show an operation of the voltage superposing circuit when medium channel in the TV band, which exist between the low and high channels, is selected. In this instance, the channel 2 in the VHF low band is selected. As seen from FIG. 5A, a pulse period (low level period) of the channel select pulse signal is longer than that in the low channel. Therefore, an average level of the channel select voltage Va, which is caused by the channel select pulse signal, is higher than that in the low channel. Further, an amount (shaded portion in FIG. 5B) of the adjusting current for the charge/discharge current of the capacitor C11, is also large, and therefore the range of the AFT voltage change ΔVT for the tuning voltage VT broadens, as shown in FIG. 5C.

When a high channel in the TV band is received, the pulse period (low level period) of the channel select signal is further broadened, as shown in FIG. 6A. With this, the channel select voltage Va increases and approximates to the voltage at the power source terminal (+)B, as shown in FIG. 6B. The current change ΔIc flows for an increased time duration. Consequently, a width of the change ΔVT of the tuning voltage VT is further increased as shown in FIG. 6C.

Figure 1:
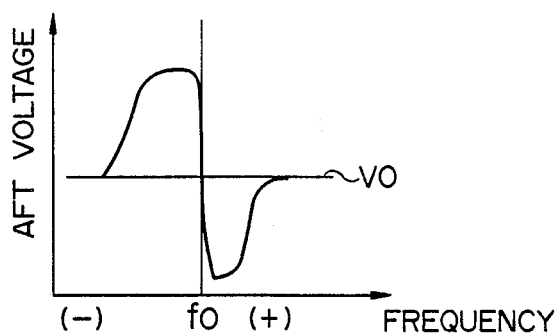
FIG. 1 is a graph showing a relationship between an AFT voltage and frequency deviation from the center frequency of the intermediate frequency.
Figure 2:
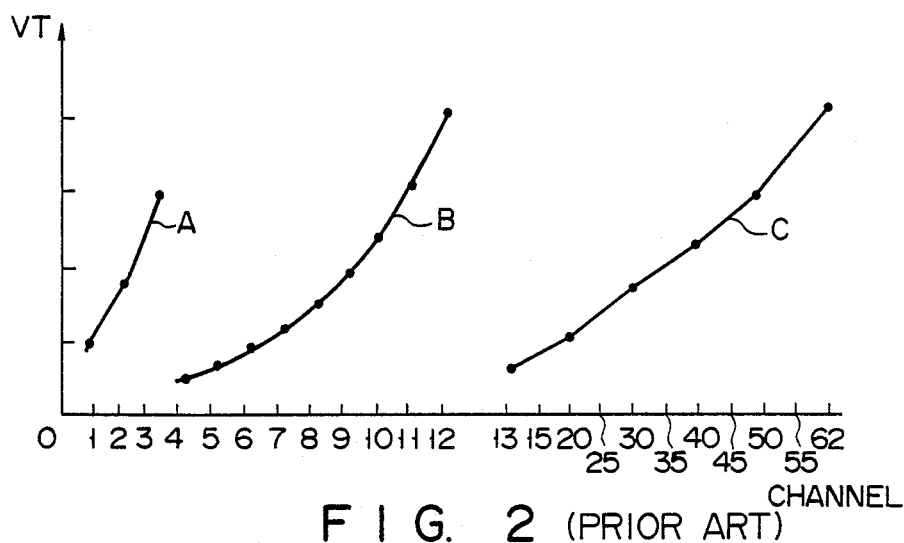
FIG. 2 is a graph showing relationships between a tuning voltage and channel numbers.

As seen from the foregoing description, the voltage superposing circuit according to the present invention makes use of the fact that the off-period of the transistor Q11 changes with the selected channel number. The duration of a change ΔIc of the operating current Ic of the transistor Q23, which is for generating a change of the AFT voltage, is varied in accordance with the change of the off-period of the transistor Q11. Accordingly, a change of the AFT voltage, which is appropriate to the selected channel, can be obtained and applied to the tuner. With the above feature, the AFT pull-in ranges, which are uniform for all the channels in the TV bands in spite of the calibration characteristic as shown in FIG. 2, have successfully be realized. This fact indicates that a viewer can enjoy the TV program of any channel with the same receiving characteristics.

FIG. 7 shows relationships between the tuning voltage vs. pulse duty ratio. In the figure, the ordinate represents a voltage, and the abscissa is representative of a duty ratio (%). As seen from the graph, the range of a change (denoted as ΔVT and defined by two dotted lines) of the AFT voltage ΔAFT with respect to the tuning voltage will be wider, the larger the duty ratio is. Therefore, an AFT voltage range appropriate to the characteristic of FIG. 2 can be set. In FIG. 7, VAFT (−) indicates that the VAFT voltage applied to the terminal 13 changes to the (−) side. Likewise, VAFT (+) indicates that the VAFT voltage changes to the (+) side. The range of the VAFT voltage broadens, the further the voltage Va increases.

During the AFT operation, an AFT defeat voltage exhibits a high level, and under this condition, the transistor Q26 is placed in an on state. When the AFT defeat voltage goes low in level (viz., the AFT mode is removed), the collector potential of the transistor Q26 rises, and the transistor Q24 and the diode D21 are successively turned on. Finally, the base potential of the transistor Q22 is maintained at a voltage as determined by a ratio of the resistors R32 and R24. This voltage is the reference voltage V0.

In the present embodiment of the voltage superposing circuit, by changing the band select voltage applied to the terminal 14 for each T band through the switching operation, the transistor Q23 can be appropriately biased in accordance with the calibration characteristic (FIG. 2). Accordingly, the change ΔIc in the operating current Ic of the transistor Q23 is varied, so that an AFT control sensitivity can be set up for each TV band. For example, in the VHF band, the voltage at the terminal 14 is set in a high level. With this level, the transistor Q25 is turned on to short the resistor R29. In the UHF band, a low level voltage is applied to the terminal 14, and turns off the transistor Q25. Under this condition, the resistors R28 and R29 are coupled in series, and a voltage across the series circuit biases the transistor Q23. Thus, the emitter bias of the transistor Q23 is changed in accordance with the selected TV band.

Figure 8:
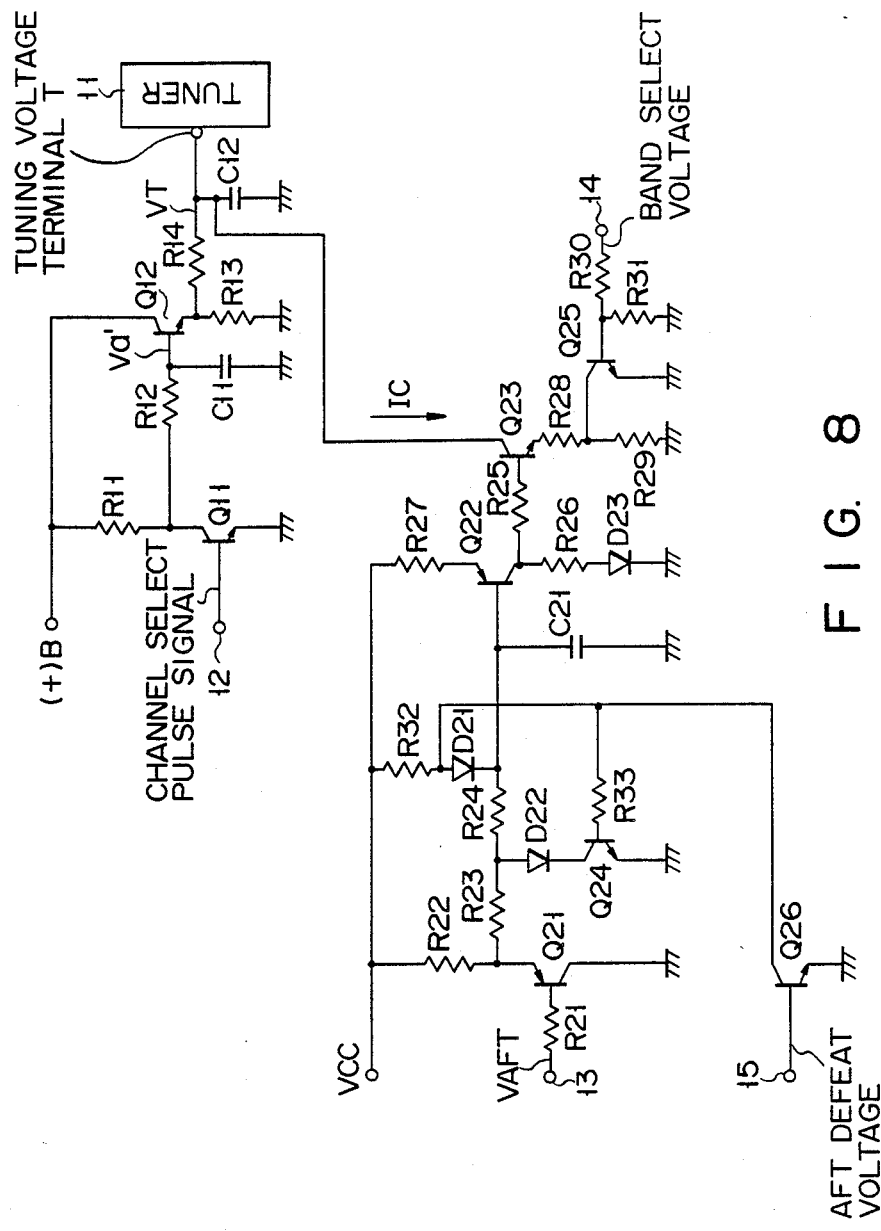
FIG. 8 is a circuit diagram showing a voltage superposing circuit for an electronic tuner according to another embodiment of the present invention.

Alternatively, the collector of the transistor Q23 may be connected to the connection point between the resistor R14 and the smoothing capacitor C12, as shown in FIG. 8.

Figure 9A:
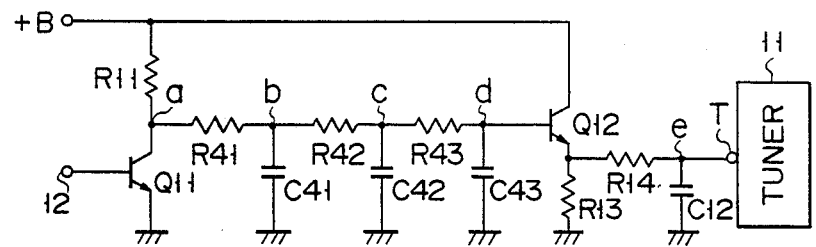
FIGS. 9A and 9B are circuit diagrams showing a voltage superposing circuit for an electronic tuner according to still another embodiment of the present invention.
Figure 9B:
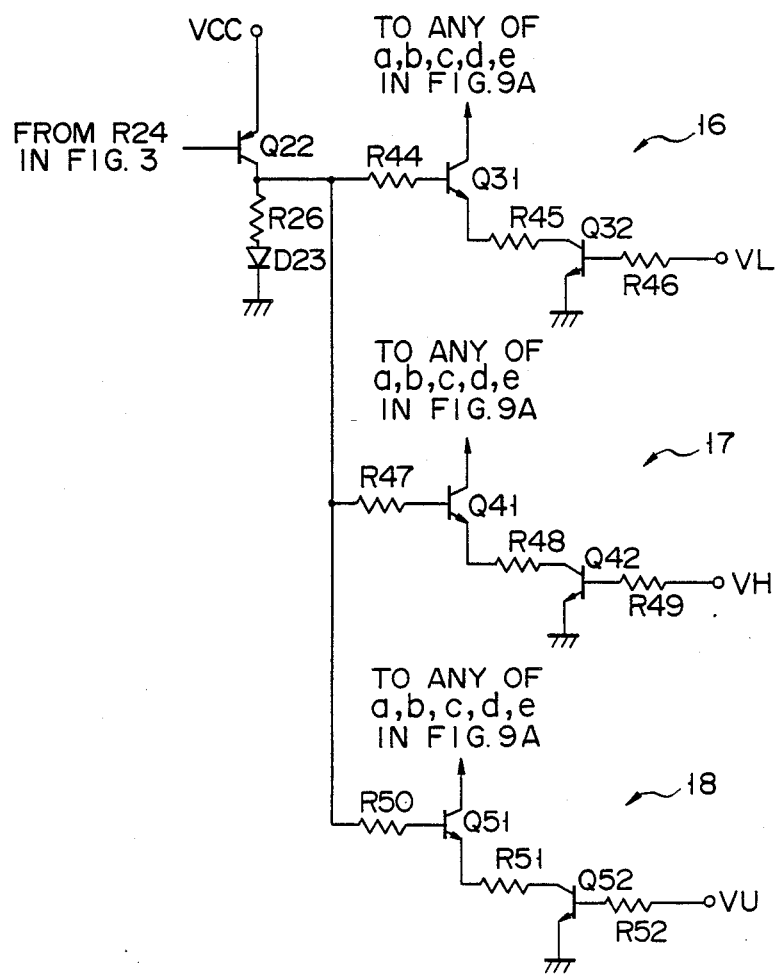

Another embodiment of a voltage superposing circuit in use with an electronic tuner according to the present invention will be described with reference to FIGS. 9A and 9B. In this embodiment, a plurality of rectifying filters are used, as shown in FIG. 9A, whereas the first embodiment of FIG. 3 uses a single rectifying filter. Additionally, this embodiment employs circuits 16, 17 and 18 for receiving voltages VL, VH, and VU of the respective TV bands. The provision of those circuits eliminate the need for the switching operation to select a desired band from among those TV bands. Remember that the operating current Ic of the transistor Q23 is switched for each band. Those circuits are respectively coupled with connecting points so as to obtain an optimum AFT control characteristic.

More specifically, as shown in FIG. 3 illustrating a circuitry in connection with the transistors Q11 and Q12, a plurality of rectifying filters made up of resistors R41 to R43 and capacitors C41 to C43 are provided between the transistors Q11 and Q12. In FIG. 9B, the circuit 16 is for the VHF low band. Transistors Q31 and Q32, respectively, correspond to the transistors Q23 and Q25 in FIG. 3. The circuit 17 is for the VHF high band. Transistors Q41 and Q42, respectively, correspond to the transistors Q23 and Q25 in FIG. 3. The circuit 18 is for the UHF band. Transistors Q51 and Q52, respectively, correspond to the transistors Q23 and Q25 in FIG. 3. The collector of each of the transistors Q31, Q41 and Q51 is connected to any of connection points "a" to "e" in FIG. 9A. The collector voltage of the transistor Q22 is applied through resistors R44, R47 and R50 respectively to the transistors Q31, Q41 and Q51.

The embodiment thus arranged may provide an improved AFT control characteristic of each TV band, which is superior to that of the voltage superposing circuit of FIG. 3 in which the bias current of the collector Q23 is switched ever time the TV band is selected.

What is claimed is:

1. A voltage superposing circuit for supplying a tuning signal including the superposition of a channel select voltage on an automatic fine tuning (AFT) voltage to a tuning voltage terminal of an electronic tuner, said voltage superposing circuit comprising:

a first transistor, with a switching function, for inverting the channel select pulse signal, the base of said first transistor being supplied with a channel select pulse signal, the collector thereof being connected through a load resistor to a voltage source, and the emitter thereof being connected to a reference potential point, said channel select pulse signals of the respective channels having different duty ratios and hence the ratios of the on- and off-periods of said first transistor differing for the respective channels;

voltage supply means for rectifying and smoothing a pulse signal at the collector of said first transistor and supplying the rectified and smoothed pulse signal to the tuning voltage terminal of the electronic tuner, said voltage supply means containing capacitive means, being coupled with said voltage source in a DC mode, for charging and discharging under control of the switching operation of said first transistor; and transistor means of which the base is supplied with a DC voltage proportional to said AFT voltage, and the collector-emitter major current path is connected between a charge/discharge path of said capacitive means and the reference potential point.

2. The circuit according to claim 1, wherein said capacitive means includes a first capacitor, and said voltage supply means includes:

a second transistor of which the collector is connected to said voltage source, and the emitter is connected through a second resistor to the reference potential point;

rectifying means for rectifying the pulse signal at the collector of said first transistor, said rectifying means containing a series circuit made up of said first capacitor and a third resistor connected between the collector of said first transistor and the reference potential point; and smoothing means for smoothing the rectified pulse signal from said rectifying means, said smoothing means containing a series circuit made up of a second capacitor and a fourth resistor connected between the emitter of said second transistor and the reference potential point a node between said fourth resistor and said second capacitor being connected to the tuning voltage terminal of the electronic tuner.

3. The circuit according to claim 2, wherein said transistor means includes a third transistor, and the collector of said third transistor is connected to a node between the collector of said first transistor and said third resistor, and the emitter of said third transistor is connected to the reference potential point by way of fifth and sixth resistors.

4. The circuit according to claim 3, further comprising switching means for switching a current flowing through a major current path of said third transistor in accordance with a selected frequency band.

5. The circuit according to claim 4, wherein said switching means includes a shortcircuiting means for shortcircuiting said sixth resistor when a specific frequency band is selected.

6. The circuit according to claim 5, wherein said shortcircuiting means includes:

a terminal for receiving a voltage signal corresponding to a selected frequency band;

a series circuit made up of seventh and eighth resistors connected between said terminal and the reference potential point; and a fourth transistor of which the base is connected to a node between said seventh and eighth resistors, the collector is connected to a node between said fifth and sixth resistors, and the emitter is connected to the reference potential point.

7. The circuit according to claim 2, wherein said transistor means includes a third transistor, and the collector of said third transistor is connected to a node between said fourth resistor and said second capacitor, and the emitter of said third transistor is connected to the reference potential point by way of fifth and sixth resistors.

8. The circuit according to claim 7, further comprising switching means for switching a current flowing through a major current path of said third transistor in accordance with a selected frequency band.

9. The circuit according to claim 8, wherein said switching means includes a shortcircuiting means for shortcircuiting said sixth resistor when a specific frequency band is selected.

10. The circuit according to claim 9, wherein said shortcircuiting means includes:

a terminal for receiving a voltage signal corresponding to a selected frequency band;

a series circuit made up of seventh and eighth resistors connected between said terminal and the reference potential point; and a fourth transistor of which the base is connected to a node between said seventh and eighth resistors, the collector is connected to a node between said fifth and sixth resistors, and the emitter is connected to the reference potential point.

11. The circuit according to claim 1, wherein said capacitive means includes a plurality of first capacitors, and said voltage supply means includes:

a second transistor of which the collector is connected to said voltage source and the emitter is connected through a second resistor to the reference potential point;

rectifying means for rectifying the pulse signal at the collector of said first transistor, said rectifying means making up of a first series circuit and said plurality of first capacitors, said first series circuit making up of a plurality of third resistors connected between the collector of said first transistor and the base of said second transistor, and said plurality of first capacitors being respectively connected between said third resistors and the reference potential point and between the base of said second transistor and the reference potential point; and smoothing means for smoothing the rectified pulse signal from said rectifying means, said smoothing means containing a second series circuit made up of a fourth resistor and a second capacitor, said second series circuit being connected between the emitter of said second transistor and the reference potential point, and a node between said forth resistor and said second capacitor being connected to the tuning voltage terminal of the electronic tuner.

12. The circuit according to claim 11, wherein said transistor means includes a plurality of third transistors, and the collector of each third transistor is connected to any of the collector of said first transistor, nodes between said third resistors and said first capacitors, the base of said second transistor, and the node between said forth resistor and said second capacitor.

13. The circuit according to claim 12, wherein said third transistors are provided corresponding to receiving frequency bands, respectively.

14. The circuit according to claim 13, further comprising bias means, provided respectively corresponding to said third transistors, for providing bias voltages respectively appropriate to the receiving frequency bands to the emitter of said third transistor.

15. The circuit according to claim 14, wherein each of said bias means includes:

terminals for respectively receiving voltages corresponding to the receiving frequency bands; and fourth transistors of which the bases are respectively connected through fifth resistors to said terminals, the collectors are respectively connected to sixth resistors to said third transistors; and the emitters are connected to the reference potential point.

* * * * *